(12) United States Patent
Hyman et al.

(10) Patent No.: US 11,444,628 B2
(45) Date of Patent: Sep. 13, 2022

(54) FAST BANDWIDTH SPECTRUM ANALYSIS

(71) Applicant: IXI Technology Holdings, Inc., Yorba Linda, CA (US)

(72) Inventors: Daniel Hyman, Long Beach, CA (US); Jeffrey Norris, Lake Forest, CA (US); Michael Dekoker, Eastvale, CA (US); Anthony Aquino, Brea, CA (US)

(73) Assignee: IXI Technology Holdings, Inc., Yorba Linda, CA (US)

( * ) Notice: Subject to any disclaimer, the term of this patent is extended or adjusted under 35 U.S.C. 154(b) by 0 days.

(21) Appl. No.: 17/403,763

(22) Filed: Aug. 16, 2021

(65) Prior Publication Data

US 2022/0038107 A1  Feb. 3, 2022

Related U.S. Application Data

(63) Continuation of application No. 16/746,939, filed on Jan. 19, 2020, now Pat. No. 11,095,298.

(51) Int. Cl.

| | | |
|---|---|---|
| *H03L 7/183* | (2006.01) | |
| *H03L 7/099* | (2006.01) | |
| *H03M 1/30* | (2006.01) | |
| *H03L 7/081* | (2006.01) | |
| *H03M 1/00* | (2006.01) | |
| *H03L 7/089* | (2006.01) | |

(52) U.S. Cl.
CPC ............ *H03L 7/183* (2013.01); *H03L 7/0816* (2013.01); *H03L 7/0891* (2013.01); *H03L 7/099* (2013.01); *H03M 1/001* (2013.01); *H03M 1/303* (2013.01)

(58) Field of Classification Search
CPC . H03L 7/06; H03L 7/08; H03L 7/0816; H03L 7/083; H03L 7/085; H03L 7/089; H03L 7/0891; H03L 7/099; H03L 7/183; H03L 7/185; H03L 7/187; H03L 7/189; H03M 1/001; H03M 1/28; H03M 1/30; H03M 1/303; H03M 1/305; H03M 1/306
See application file for complete search history.

(56) References Cited

U.S. PATENT DOCUMENTS 5,909,149 A * 6/1999 Bath ..................... H03L 7/099
 331/25
2016/0036486 A1* 2/2016 Sestok, IV ............ H04L 7/0331
 455/77

* cited by examiner

*Primary Examiner* — Diana J. Cheng
(74) *Attorney, Agent, or Firm* — The Watson IP Group, PLC; Jovan N. Jovanovic

(57) ABSTRACT

An apparatus includes a processor, a Phase-Locked Loop Waveform Generator (PLLWG), a Voltage Controlled Oscillator (VCO), a demodulator, signal conditioning circuitry, and an Analog-to-Digital Converter (ADC). The processor generates control command signals, receives a digital data input signal, and performs spectrum analysis on the digital data input signal. The PLLWG is coupled to the processor, receives the control command signals, and generates a charge pump output signal based on the control command signals. The VCO is coupled to the PLLWG, receives a tuning signal based on the charge pump output signal, and outputs a VCO output signal based on the tuning signal. The demodulator receives an incoming modulated signal and the VCO output signal, and outputs an analog output signal based on the incoming modulated signal and the VCO output signal. The ADC converts the analog output signal into the digital data input signal.

12 Claims, 3 Drawing Sheets

FAST BANDWIDTH SPECTRUM ANALYSIS

CROSS-REFERENCE TO RELATED APPLICATION

The present application is a continuation of U.S. patent application Ser. No. 16/746,939 filed on Jan. 19, 2020, entitled "FAST BANDWIDTH SPECTRUM ANALYSIS", the entire specification of which is hereby incorporated by reference in its entirety.

BACKGROUND OF THE DISCLOSURE

1. Field of the Disclosure

The disclosure relates in general to spectrum analysis, and more particularly, to fast narrow bandwidth spectrum analysis.

2. Background Art

Spectrum analysis entails measuring and reporting the magnitude of an input signal as a function of its frequency. An example of such analysis includes measuring the power level of a spectrum of known and unknown signals. Spectrum analysis can be used to analyze electromagnetic signals over a defined band of frequencies. It can be used to determine the frequencies of transmission sources, such as wireless networking equipment, e.g., Wi-Fi and wireless routers, cellular equipment, drones and their associated remote controllers, and other consumer, industrial, and military RF emitters.

SUMMARY OF THE DISCLOSURE

The disclosure is directed to an apparatus that is comprised of a processor, a Phase-Locked Loop Waveform Generator (PLLWG), a Voltage Controlled Oscillator (VCO), a demodulator, and an Analog-to-Digital Converter (ADC). The processor generates control command signals, receives a digital data input signal, and performs spectrum analysis on the digital data input signal. The PLLWG is coupled to the processor, receives the control command signals, and generates a charge pump output signal based on the control command signals. The VCO is coupled to the PLLWG, receives a tuning signal based on the charge pump output signal, and outputs a VCO output signal based on the tuning signal. The demodulator receives an incoming modulated signal and the VCO output signal, and outputs an analog output signal based on the incoming modulated signal and the VCO output signal. The ADC converts the analog output signal into the digital data input signal.

In some configurations, the VCO is a first VCO and the VCO output signal is a first VCO output signal, where the apparatus further comprises a second VCO and a tuning signal. The second VCO is coupled to the PLLWG and receives the tuning signal based on the charge pump output signal and outputs a second VCO output signal based on the tuning signal. The tuning signal switch receives the charge pump output signal and selectively outputs a first raw tuning signal and a second raw tuning signal directed to the first VCO and the second VCO, respectively. The demodulator is an IQ demodulator that receives a selected frequency signal based on one of the first and second VCO output signals, and outputs an in-phase analog signal and a quadrature analog signal based on the incoming modulated signal and one of the first and second VCO output signals. The ADC converts the in-phase analog signal and the quadrature analog signal into a digital data input signal, and outputs the digital data input signal to the processor.

In some configurations, the tuning signal switch is a single-pole, double throw switch with an on-state resistance below 5 Ohms and an off-state capacitance below 50 pF.

In some configurations, the apparatus further comprises a first Phase-Locked Loop (PLL) filter and a second PLL filter. The first PLL filter is coupled to both the PLLWG and the first VCO, and receives a first raw tuning signal and conditions the first raw tuning signal. The second PLL filter is coupled to both the PLLWG and the first VCO, and receives a second raw tuning signal and conditions the second raw tuning signal.

In some configurations, the apparatus further comprises an IQ conditioner that receives an in-phase analog signal and a quadrature analog signal from the IQ demodulator, and generates an in-phase analog data signal and a quadrature analog data signal from the in-phase analog signal and the quadrature analog signal, respectively.

In some configurations, the apparatus further comprises an image rejection circuit that receives the in-phase analog data and the quadrature analog data from the IQ conditioner, provides a relative phase shift between the in-phase analog data and the quadrature analog data to match the in-phase analog data and the quadrature analog data in phase while preserving relative amplitudes thereof, and sums the in-phase analog data and the quadrature analog data together to generate a combined analog data signal. Furthermore, the relative phase shift between the in-phase analog data and the quadrature analog data ensures that, when summed, the image portion of the combined analog data signal is removed.

In some configurations, the apparatus further comprises a VCO select switch, coupled to the first VCO and the second VCO, to receive both the first VCO output signal and the second VCO output signal and selectively output one of the first VCO output signal and the second VCO output signal.

In some configurations, the VCO includes an oscillator element and a VCO amplifier. The oscillator element generates a radio frequency signal of a frequency determined by a voltage level of the charge pump output signal and the VCO amplifier amplifies the radio frequency signal and outputs the VCO output signal.

In some configurations, the VCO is one of a Maxim MAX2623 VCO and a Maxim MAX2622 VCO.

In some configurations, the processor is one of an NXP LPC43S70 with 16 double-buffered 32-bit first-in-first-out Serial General Purpose Input/Output (SGPIO) pins capable of bit-shifting operation up to 102 Mbps, a Field Programmable Gate Array (FPGA), and a System On a Chip (SOC).

The disclosure is also directed to a method that comprises generating control command signals, receiving a digital data input signal, and performing spectrum analysis on the digital data input signal, by a processor, and receiving the control command signals and generating a charge pump output signal based on the control command signals, by a PLLWG coupled to the processor. The method further comprises receiving a tuning signal based on the charge pump output signal and outputting a VCO output signal based on the tuning signal, by a VCO coupled to the PLLWG, and receiving an incoming modulated signal and the VCO output signal, and outputting an analog output signal based on the incoming modulated signal and the VCO output signal, by a demodulator. The method yet further comprises converting the analog output signal into the digital data input signal, by an ADC.

In some configurations, the VCO is a first VCO, the VCO output signal is a first VCO output signal, and the demodulator is an IQ demodulator, the method further comprising receiving the tuning signal based on the charge pump output signal and outputting a second VCO output signal based on the tuning signal, by a second VCO coupled to the PLLWG, and receiving the charge pump output signal and selectively outputting a first raw tuning signal and a second raw tuning signal directed to the first VCO and the second VCO, respectively, by a tuning signal switch. The method yet further comprises receiving a selected frequency signal based on one of the first and second VCO output signals, and outputting an in-phase analog signal and a quadrature analog signal based on the incoming modulated signal and one of the first and second VCO output signals, by the IQ demodulator, and converting the in-phase analog signal and the quadrature analog signal into a digital data input signal, and outputting the digital data input signal to the processor, by the ADC.

In some configurations, the tuning signal switch of the method is a single-pole, double throw switch with an on-state resistance below 5 Ohms and an off-state capacitance below 50 pF.

In some configurations, the method further comprises receiving a first raw tuning signal and conditioning the first raw tuning signal, by a first Phase-Locked Loop (PLL) filter coupled to both the PLLWG and the first VCO, and receiving a second raw tuning signal and conditioning the second raw tuning signal, by a second PLL filter coupled to both the PLLWG and the first VCO.

In some configurations, the method further comprises receiving an in-phase analog signal and a quadrature analog signal from the IQ demodulator, and generating an in-phase analog data signal and a quadrature analog data signal from the in-phase analog signal and the quadrature analog signal, respectively, by an IQ conditioner.

In some configurations, the method further comprises receiving the in-phase analog data and the quadrature analog data from the IQ conditioner, providing a relative phase shift between the in-phase analog data and the quadrature analog data to match the in-phase analog data and the quadrature analog data in phase while preserving relative amplitudes thereof, and summing the in-phase analog data and the quadrature analog data together to generate a combined analog data signal, by an image rejection circuit. Furthermore, the relative phase shift between the in-phase analog data and the quadrature analog data ensures that, when summed, the image portion of the combined analog data signal is removed.

In some configurations, the method further comprises receiving both the first VCO output signal and the second VCO output signal and selectively output one of the first VCO output signal and the second VCO output signal, by a VCO select switch coupled to the first VCO and the second VCO.

In some configurations, the method further comprises generating a radio frequency signal of a frequency determined by a voltage level of the charge pump output signal, by an oscillator element of the VCO, and amplifying the radio frequency signal and outputting the VCO output signal, by an amplifier of the VCO.

In some configurations, the VCO of the method is one of a Maxim MAX2623 VCO and a Maxim MAX2622 VCO.

In some configurations, the processor of the method is one of an NXP LPC43S70 with 16 double-buffered 32-bit first-in-first-out Serial General Purpose Input/Output (SGPIO) pins capable of bit-shifting operation up to 102 Mbps, a Field Programmable Gate Array (FPGA), and a System On a Chip (SOC).

BRIEF DESCRIPTION OF THE DRAWINGS

The disclosure will now be described with reference to the drawings wherein.

DETAILED DESCRIPTION OF THE DISCLOSURE

Figure 1:
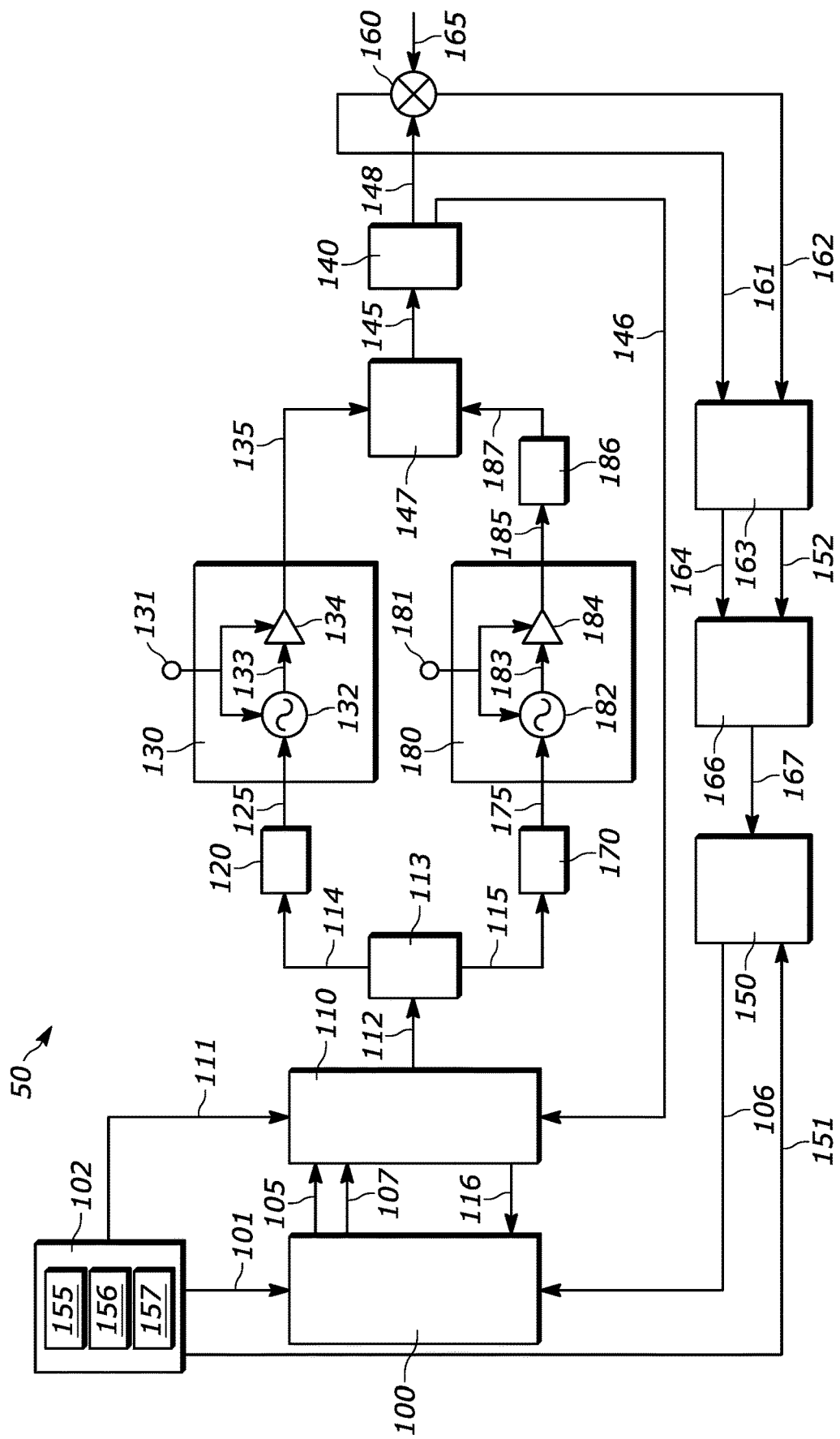
FIG. 1 illustrates an example apparatus to spectrum analyze an incoming modulated signal, in accordance with at least one embodiment disclosed herein.

While this disclosure is susceptible of embodiment(s) in many different forms, there is shown in the drawings and described herein in detail a specific embodiment(s) with the understanding that the present disclosure is to be considered as an exemplification and is not intended to be limited to the embodiment(s) illustrated.

It will be understood that like or analogous elements and/or components, referred to herein, may be identified throughout the drawings by like reference characters. In addition, it will be understood that the drawings are merely schematic representations of the invention, and some of the components may have been distorted from actual scale for purposes of pictorial clarity.

Referring now to the drawings and in particular to FIG. 1, an embodiment is disclosed that includes an apparatus 50 illustrated as including a plurality of components. The apparatus 50 receives a modulated RF signal and accurately measures a center frequency and occupied bandwidth of the modulated RF signal. Such capability is a potentially valuable aspect of signal analytics, whether or not the data content of the received modulated RF signal itself is explicitly extracted. In at least one embodiment, the apparatus 50 includes a pair of VCOs that are controlled by a single PLLWG, as discussed in more detail below. The apparatus 50 permits a fast ramp to be performed over one VCO, then switched to a second VCO with its own completely different fast ramp, all using a same microprocessor, PLLWG, and modulation conditioning components. This has an advantage in a receiver subsystem that is expected to operate in short windows of time-division-duplexed allocation. In the example of FIG. 1, the apparatus 50 can perform receive operations in windows of time that are, e.g., 2.5 μsec long, with one sampling event performed every 25 μsec during transmit operations. This results in a 90% transmit duty cycle and 10% receive duty cycle that advances over two orders of magnitude faster than is possible with typical radio communication systems. The apparatus 50 has such advantages while being a relatively simple apparatus, small, and low-powered and having rapid stepping capability.

The timing constraints of the example of FIG. 1 are that one VCO must be locked and in use serving as the local oscillator for down-conversion during the 2.5 μsec receive period. The other VCO is idle (i.e., not locked or tuning) or turned off (e.g., to minimize coupled noise, harmonics, and/or spurious emissions into the receive chain) during this time. Then when the apparatus 50 resumes transmit mode, the apparatus 50 has ~20 pec to either adjust the center frequency of the present VCO to the next frequency value to receive a different subset of the same band or to switch to the new VCO and lock frequency (at a minimum for received signal envelope detection) and/or phase (if also decoding data). Typical PLL+VCO combinations cannot accomplish this timing requirement and frequency flexibility with a tight size, cost, and power budget constraints.

The apparatus 50 includes a processor, such as microcontroller 100 that generates control command signals 107 for the apparatus 50. In at least one embodiment, the microcontroller 100 includes double-buffered pins with bit shifting of at least 40 Mbps. In at least one embodiment, the microcontroller 100 is an NXP LPC43S70 with 16 double-buffered 32-bit first-in-first-out SGPIO pins capable of bit-shifting operation up to 102 Mbps. In other embodiment(s), one or more of any number of available components, such as a microprocessor(s), FPGA(s), or SOC(s) can perform role of the microcontroller 100.

The microcontroller 100 is coupled to a master clock generator 102 that is also coupled to a PLLWG tuner 110 and an ADC 150. The master clock generator 102 generates a microcontroller clock signal 101 and outputs this microcontroller clock signal 101 to the microcontroller 100. The master clock signal 102 is comprised of a plurality of synchronous clock generators, such as a first synchronous clock generator 155 that generates the microcontroller clock signal 101 that first synchronous clock generator 155 outputs to the microcontroller 100, a second synchronous clock generator 156 that generates a PLLWG clock signal 111 that the second synchronous clock generator 156 outputs to the PLLWG tuner 110, as well as a third synchronous clock generator 157 that generates a variable ADC clock signal 151 that the third synchronous clock generator 157 outputs to the ADC 150. It is contemplated that other timing resource configurations may be deployed in other implementations of the presently described subject matter as recognized by one skilled in the art.

The microcontroller 100 generates control commands using high-speed or GPIO digital signal pins having a 1.8V logic "high" and a rate of speed limited by its characteristics, the speed of its clock input, and the time constant of the signal line and components. The microcontroller 100 generates a step trigger signal 105 that instructs the PLLWG tuner 110 to generate a charge pump output signal 112. In at least one embodiment, the PLLWG tuner 110 is further coupled to a tuning signal switch 113. The tuning signal switch 113 receives the charge pump output signal 112 and switches the charge pump output signal 112 to one of a plurality of outputs, such as two outputs in the particular embodiment shown, although more outputs are contemplated. The tuning signal switch 113 is further coupled to a first PLL filter 120 and a second PLL filter 170. The tuning signal switch 113 outputs either a first raw tuning signal 114 or a second raw tuning signal 115, the first raw tuning signal 114 or the second raw tuning signal 115 being directed to a high-frequency VCO 130 and a low-frequency VCO 180, respectively. The tuning signal switch 113 outputs the first raw tuning signal 114 to the first PLL filter 120, which conditions the first raw tuning signal 114 into a first conditioned signal 125. Similarly, the tuning signal switch 113 outputs the second raw tuning signal 115 to the second PLL filter 170, which conditions the second raw tuning signal 115 into a second conditioned signal 175. In at least one embodiment, the tuning signal switch 113 is a single-pole, double throw switch with an on-state resistance below 5 Ohms and an off-state capacitance below 50 pF. In at least one embodiment, the tuning signal switch 113 is an ON Semiconductor NLAS5123 single-pole, double throw switch with a 1.0 Ohm on-state resistance and a 20 pF off-state capacitance for an unused output port when one output port is being used.

One skill in the art would recognize that a wide variety of switching devices and circuit configurations may be used to satisfy the functional requirements of the apparatus 50 to control the output of the PLLWG 110 into or away from at least one VCO, such as a first VCO, e.g., the high-frequency VCO 130, and the second VCO, e.g., the low-frequency VCO 180 shown, without departing from the scope of the embodiments disclosed. Depending upon the signal being detected by the apparatus 50, one skilled in the art would recognize that at least one embodiment of the apparatus 50 can utilize a single VCO, such as either the high-frequency VCO 130 or the low-frequency VCO 180, with associated components from a second VCO being likewise optionally omitted. Those skilled in the art of electronics design would recognize that alternative switching devices and circuit configurations can be used in other implementations of the presently discussed subject matter, without departing from the scope of the embodiments disclosed. Likewise, those skilled in the art would recognize that a wide variety of on-state and off-state resistive and reactive electrical characteristics will result in these other implementations, as well as a wide variety of possible and implemented timing characteristics to meet the requirements of each application, without departing from the scope of the embodiments disclosed.

For each of the first and second raw tuning signals 114/115, either or both if not selected to pass on to its PLL filter 120/170, respectively, have an Ohmic disconnect from the charge pump output signal 112 with a low parasitic series capacitance, with the dominant electrical characteristic being a high resistance path to analog reference ground. The purpose of this disconnect is to ensure a minimum of signal leakage to the unused path, and the purpose of the pre-set voltage is to provide a deterministic voltage level as an input to the first PLL filter 120 and to the second PLL filter 170 in such cases when they are not selected. It is recognized that these filtering circuits have a propensity for instability under certain operating conditions when they have a floating voltage for an input. In at least one embodiment, the tuning signal switch 113 has an off-state capacitance of only 20 pF, meaning only high frequency content of the charge pump output signal 112 will pass through to the unselected port.

One skilled in the art would recognize that a wide variety of PLL filter designs may be used in other embodiments of the presently disclosed subject matter, without departing from the scope of the embodiments. Some of these designs can include active architectures and some of which can include passive architectures. Each circuit can be comprised of resistive and reactive components of various component values and organization. In at least one embodiment in which only passive components are utilized, a pre-set voltage can be omitted, as without an active element, with the apparatus still being stable. In at least one embodiment utilizing active components, that a variety of pre-set voltages can be used, and others not requiring pre-set voltages at all for embodiments that are unconditionally stable. Such electrical engineering details and opportunities for component selection, configuration, and reduction are left for those skilled in the art, without departing from the scope of the embodiments disclosed.

The first and second PLL filters 120/170 are coupled to first and second VCOs, the high-frequency and low-frequency VCOs 130/180, respectively. The first conditioned signal 125 signal is used for tuning the output frequency of the first high-frequency VCO 130. In an analogous fashion, the second conditioned signal 175 is used for tuning the output frequency of the low-frequency VCO 180. The high-frequency VCO 130 is powered by a first VCO voltage 131, and the low-frequency VCO 180 is powered by a second VCO voltage 181, e.g., both 4.50 V. In at least one embodiment, the high-frequency VCO 130 is a Maxim MAX2623 VCO, a monolithic microwave integrated circuit that tunes from 885 to 950 MHz based on the input tuning voltage range of 0.4 to 2.4V and with output power that ranges between −14 and +0 dBm having phase noise of −101 dBc/Hz at 100 kHz offset. In at least one embodiment, the low-frequency VCO 180 is a Maxim MAX2622 VCO, which tunes from 855 to 881 MHz but has otherwise similar characteristics. The output frequency can change at a moderate slew rate (~100 MHz per microsecond) but only when presented with a strongly driven tuning signal. This reduced slew rate compared to other VCOs is the primary reason a buffering/integrating amplifier is incorporated into the PLL filters 120/170 to maintain stability at a high rate of tuning speed. One skilled in the art would recognize that the channel frequency, power level, voltage requirements, phase noise, slew rate, and other physical and electrical characteristics of other embodiments of the presently described subject matter may be significantly higher or lower based on the VCO used, without departing from the scope of the embodiments disclosed.

The high-frequency VCO 130 includes a first VCO oscillator 132 and a first amplifier 134. The first VCO oscillator 132 receives the first conditioned signal 125 and generates a first RF frequency signal 133 that the first VCO oscillator 132 outputs to the first amplifier 134. The first amplifier 134 amplifies the first RF frequency signal 133 and generates a first amplified VCO output signal 135 which the high-frequency VCO 130 outputs. Similarly, the low-frequency VCO 180 includes a second VCO oscillator 182 and a second amplifier 184. The second VCO oscillator 182 received the second conditioned signal 175 and generates a second RF frequency signal 183 that the second VCO oscillator 182 outputs to the second amplifier 184. The second amplifier 184 amplifies the second RF frequency signal 183 and generates a second amplified VCO output signal 185 that the low-frequency VCO 180 outputs. In at least one embodiment, the low-frequency VCO is further coupled to a frequency divider 186. It is at this point where divergence occurs between the high-frequency VCO 130 and low-frequency VCO 180, as the second amplifier 184 outputs the second amplified VCO output signal 185 to the frequency divider 186. The frequency divider 186 receives the second amplified VCO output signal 185 and outputs a divided second output signal 187.

In at least one embodiment, the frequency divider 186 is an Analog Devices HMC432 monolithic microwave integrated circuit that divides its frequency input by two to generate an output having half the frequency and a power level of −9 to −3 dBm, but otherwise similar electrical characteristics of its frequency input. In other embodiments of the presently disclosed subject matter, other VCOs and/or frequency dividers can be used. Similarly, frequency multipliers can be used, or no frequency adjustment devices can be used. One skilled in the art would also recognize that power splitters may be implemented immediately after each output signal is generated for feedback to the PLLWG, or before or after a frequency adjustment or selection device in the chain without divergence from the presently described subject matter. These minor variations, as well as other amplification, attenuation, and/or matching circuit variations, are well-known and available to those skilled in the art of RF electronics design.

The high-frequency VCO 130 and the frequency divider 186 are both further coupled to a VCO select switch 147. The VCO select switch 147 receives both the first amplified VCO output signal 135 and a form of the second amplified VCO output signal 185, the divided second output signal 187, and selectively outputs one of the first amplified VCO output signal 135 and the divided second output signal 187. The VCO select switch 147 is an RF switching component that presents zero or one input to its output, such as a selected frequency signal 145. The VCO select switch 147 switches to a termination which is an input not selected for transmission, in at least one embodiment being a 50 Ohm broadband resistive load to ground. In at least one embodiment, this termination is designed into the VCO select switch 147 component itself. In at least one embodiment, the RF switch 147 is a Peregrine Semiconductor PE42420, a single-pole double throw switch with integrated 50 Ohm termination to ground and a switching time of 300 nsec. In other embodiments, many other types of switching components and/or terminations can be used without departing from the scope of the disclosure.

The VCO select switch 147 is further coupled to an RF splitter 140. The RF splitter 140 receives the selected frequency signal 145 and transforms the selected frequency signal 145 into two signals, such as a selected frequency output signal 148 and a selected frequency feedback 146. In at least one embodiment, the RF splitter 140 includes a Programmable Logic Device (PLD) circuit. The RF splitter 140 outputs the selected frequency feedback 146 to the PLLWG tuner 110 that receives and measures, via the PLD circuit inside, the selected frequency feedback 146 and matches it to a target output frequency. In at least one embodiment, the apparatus 50 locks frequency in a time period of between 0.5 and 3 pec for steps of 9.5 MHz. It is recognized that this time period applies for operation of the example of FIG. 1 at any faster sampling rate up to and including 60 MSPS.

Figure 2:
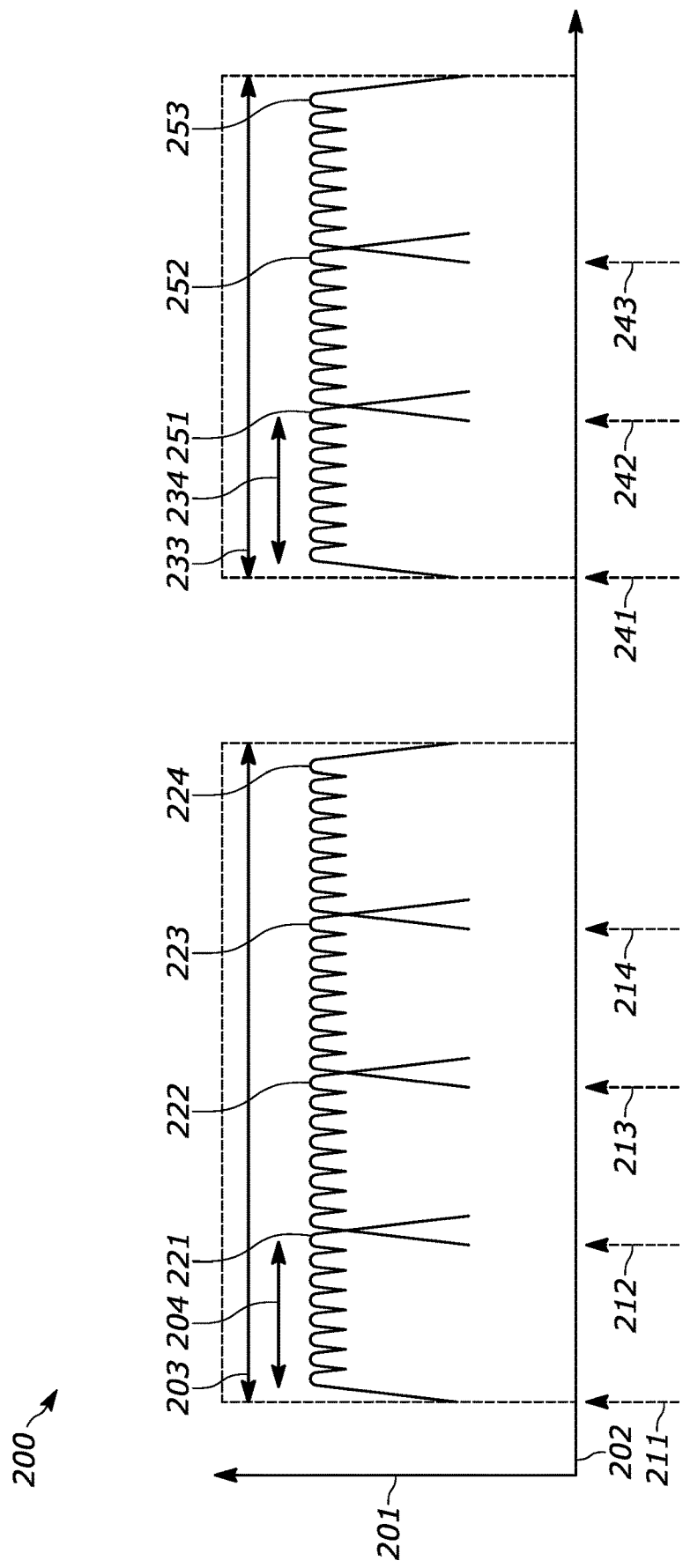
FIG. 2 illustrate an example graph showing frequencies stepped through by the two VCOs of the apparatus of FIG. 1, in accordance with at least one embodiment disclosed herein.

FIG. 2 illustrates a graph 200 showing frequencies stepped through by the two VCOs of the apparatus 50 of FIG. 1. The graph 200 has a y-axis 201 showing the amplitude of receive sensitivity and potential amplitude of incoming signals. The x-axis 202 of the graph 200 shows the frequency of the VCO center channels and incoming signals. The low-frequency bandwidth 203 covers a range of frequencies from 420 to 450 MHz, representing the U.S. ham radio band. The high-frequency bandwidth 233 covers a range of frequencies from 902 to 928 MHz overlapping with the U.S. 900 MHz industrial, scientific, and Industrial, Scientific, and Medical (ISM) band. The low sub-bandwidth 204 illustrates the bandwidth of interest for each analytical step, representing 8 MHz of frequency content that will be sampled at 20 Msps. Note that the 20 Msps sampling contains data up to 10 MHz subject to the Nyquist sampling criteria as known to those skilled in the art of signal analytics. Similarly, the high sub-bandwidth 234 represents 9.5 MHz of frequency content that will be sampled at 20 Msps.

The stepping pattern developed for the example of FIG. 1 is illustrated by the dashed arrows of FIG. 2. For the low-frequency bandwidth 203, the first low-frequency step 211 is at 418.00 MHz, which will provide a first low-frequency input range 221, which includes frequency content from 418 to 428 MHz. The first low-frequency input range 221 is shown with filtering characteristics suggesting the very bottom and very top frequencies taper off in amplitude. The result is that the bottom 2.00 MHz and the top 2.00 MHz of frequency content will be discarded, and the analysis will be performed on the content from 420.00 to 426.00 MHz. In a similar manner, the second low-frequency step 212 at 427.00 MHz allows the apparatus 50 to receive a second low-frequency input range 222, the third low-frequency step 213 at 435.00 MHz allows the apparatus 50 to receive a third low-frequency input range 223, and the fourth low-frequency step 214 at 443.00 MHz allows the apparatus 50 to receive a fourth low-frequency input range 224.

For the high-frequency bandwidth 233, the first high-frequency step 241 is at 901.00 MHz, which will provide a first high-frequency input range 251, which includes frequency content from 901 to 913 MHz. The same concept of the bottom 1.00 MHz and the top 2.50 MHz of frequency content will be discarded, and the analysis will be performed on the content from 902.00 to 910.50 MHz. In a similar manner, the second high-frequency step 242 at 910.50 MHz allows the apparatus 50 to receive a second high-frequency input range 252, the third high-frequency step 243 at 920.00 MHz allows the apparatus 50 to receive a third high-frequency input range 223.

Several different step programs can be accessed by the microcontroller 100 during operation to coincide with a demand for either fine or coarse sampling of received emissions in specific sub-bands. The master clock signal 102 is variable and can accommodate changes in the ADC clock signal 151 needed to change sampling speeds for wider or narrower bandwidth as known to those skilled in the art of signal processing. In at least one other embodiment of the presently described subject matter, other frequencies of preferred steps, bandwidths of interest, and/or partial bands for rejection above, below, or in the interim bandwidth can be used by those skilled in the art of signal processing to meet a wide range of potential applications.

When the microcontroller 100 first triggers, by the step trigger signal 105, the PLLWG tuner 110 to begin output suitable for coverage of the high-frequency bandwidth 233, the first frequency target is the first high-frequency step 241, permitting the reception of the first high-frequency input range 251. At the next triggering of step trigger signal 105, the PLLWG tuner 110 steps to the second high-frequency step 242, permitting the reception of the second high-frequency input range 252. This process repeats through a fourth high-frequency step (not shown), accomplished in a similar manner, whereupon additionally the PLLWG tuner 110 transmits a ramp complete signal 116 to the microcontroller 100. The process for the coverage of the low-frequency bandwidth 203 is analogous, with the PLLWG tuner 110 generating same ramp complete signal 116 to the microcontroller 100 when complete. Note that in at least one embodiment utilizing two PLLWGs, the channel center frequencies detailed in each ramp's definition in the first PLLWG and second PLLWG can be completely different, with different start, stop, step size, and/or number of steps. These ramp definitions can also change in one or both of the PLLWGs during operation as required.

In at least one embodiment, the example of FIG. 1 and FIG. 2 can use frequency selection data as part of the step trigger signal 105 to define a center frequency in a conventional manner than is provided for in the stepped ramp approach. The time it takes to lock onto a new frequency in this mode is much longer than with other modes. However, this provides for a means to "zoom in" to a signal identified in a coarse scan by selecting a frequency immediately below the frequency of interest without having to cycle through steps of a many-step ramp to get to a single frequency location of interest.

In at least one other embodiment of the presently disclosed subject matter, the main pre-selected channels will not be progressed in a monotonic upwards or downwards fashion, and instead will vary based on the presence of target radio activity that must be monitored along with scanning through the rest of the band to detect new activity in other parts of each band. Similarly, the manner in which demodulation occurs will also vary in certain embodiment(s) of the presently disclosed subject matter, so that demodulation with coarse signals having few data points may be interspersed with fine signal analytics having many more data points. This permits finer analysis of precise channel occupancy by target radio emissions, as well as modulation type and subcarrier spacing. These and other transmission characteristics may be of interest in a variety of applications where rapidly adaptive scanning and demodulation is of intrinsic value.

Once the selected frequency output signal 148 of the example apparatus 50 of FIG. 1 has been selected, the operation continues. The RF splitter 140 is further coupled to an IQ demodulator 160 shown as also being coupled to an IQ conditioner 163. The IQ demodulator 160 receives an incoming modulated signal 165 (the signal to be analyzed by the apparatus 50) as one input, with the selected frequency signal 148, known as the local oscillator for the demodulation circuit, being received as a second input from the RF splitter 140. The IQ conditioner 163 receives an in-phase analog output signal 161 and a quadrature analog output signal 162 from the IQ demodulator 160, two signals that contain the data that had previously been incorporated into the incoming RF signal of interest. The IQ conditioner 163 generates an in-phase analog data signal 164 and a quadrature analog data signal 152 from the in-phase analog output signal 161 and the quadrature analog output signal 162, respectively. Such conditioning in the analog domain involves a switchable amplification stage, multi-pole filtering, and tunable amplification as a driver stage prior to introduction to an image reject circuit. In at least one embodiment, the IQ conditioner 163 is an Analog Devices ADRF6510, a monolithically integrated circuit combining a matched pair of differential switched gain amplifiers, programmable low-distortion 6-pole filters for anti-aliasing, and low-noise amplification/attenuation stages for each of the in-phase and quadrature data channels, suitable for directly driving operational amplifiers of an image reject circuit or an ADC. In at least one other embodiment, a wide variety of IQ conditioning circuitry can be used. Examples of potential IQ conditioning circuitry known to those skilled in the art of signal analytics include passive filters, active filters, switched gain stages, low noise amplifiers, variable attenuators using switched resistive networks, variable amplifiers using switched gain networks, and other fixed and tunable signal conditioning circuits available to those skilled in the art of RF and analog electronics design. In at least one embodiment, a low pass filter (not shown), such as a programmable anti-alias filter, is disposed before the ADC 150. In at least one embodiment, the IQ conditioner 163 includes such a low pass filter. In at least one embodiment, the IQ conditioner 163 includes a signal gain control.

In at least one embodiment, the IQ conditioner 163 is further coupled to an image reject circuit 166. The image reject circuit 166 receives the in-phase analog data signal 164 and the quadrature analog data signal 152 from the IQ conditioner 163. The image reject circuit 166 provides a relative phase shift between the two data streams using operational amplifier circuitry to match the real signal content in phase while preserving relative amplitudes, matching the image signal content 180 degrees out of phase while preserving relative amplitudes, then sums the two signals together into a single output as a combined analog data signal 167. The relative phase shift between the in-phase analog data and the quadrature analog data ensures that, when summed, the image portion of the combined analog data signal is removed. This provides a single (stronger) real data signal containing the amplitude data of the original signal at a single sideband of real content while eliminating the second sideband of image content. Single-sideband conversion is a significant advantage well known to those skilled in the art of signal analytics. In at least one other embodiment of the presently discussed subject matter, instead of combining the in-phase and quadrature data in the analog domain these signals are phase shifted and then compensated for in the digital domain to eliminate the image content. This has the advantage of eliminating the analog image reject circuit for a savings in circuit board space and layout complexity, with the disadvantage of requiring additional digital signal processing and power consumption by comparison. In at least one embodiment, additional ADC and signal processing resources may not be substantially disadvantageous, whereas in other implementations, such as in the example of FIG. 1, such resource requirements were neither available nor desirable to incorporate. In the example of FIG. 1, the image reject circuit 166 is comprised of a three-stage matched-pair operational amplifier circuit, a summing circuit, a differential-to-single ended signal conversion circuit, and a level shifting circuit to present a final output with a non-zero common mode suitable for driving into the ADC 150. In at least one embodiment, the apparatus 50 can omit the image rejection circuit 166, instead utilizing separate ADC converters (not shown) for the I and Q data. In such an embodiment(s), image rejection is performed by an FPGA (not shown) or by a processor, such as the microcontroller 100.

The image rejection circuit 166 is further coupled to an ADC 150. In at least one embodiment, the ADC 150 receives the combined analog data signal 167 that includes information from the in-phase analog output signal 161 and the quadrature analog output signal 162 while rejecting the imaged content. The ADC 150 also receives the ADC clock signal 151 to sample analog data, store the sample results in an internal data buffer, and generate a digital data input signal 106. The ADC 150 outputs the digital data input signal 106, with the microcontroller 100 receiving the digital data input signal 106 and performing spectrum analysis on the digital data input signal 106. The microcontroller 100 can perform any number of different types of spectrum analysis on the digital data input signal 106, as known to those skilled in the art. In at least one embodiment, the ADC 150 can be part of a SOC, or, in at least one embodiment can be a discrete single or dual channel ADC. In at least one embodiment, the ADC 150 can include a plurality of channels with the ADC 150 utilizing a channel(s) as needed for a particular application.

A wide variety of ADCs can be used for the equivalent function in other implementations of the presently discussed subject matter, without departing from the scope of the disclosure. Such variety includes ADCs as separate components as in the present example of FIG. 1, but of different makes and models and performance characteristics. Such variety is also contemplated to include ADCs integrated internally with the microprocessors and other computing devices controlling each implementation or multiple implementations in a parallel fashion. Other combinations of ADC functionality may be programmed in the firmware of an FPGA, SOC, or other programmable computing device. Yet other embodiments are contemplated to incorporate the ADC function into a larger integrated circuit that includes the down-converting mixer, filtering, amplification, and/or image reject functions as available in the integrated component marketplace or in custom designs by those skilled in the art of RF and analog electronics design.

Figure 3:
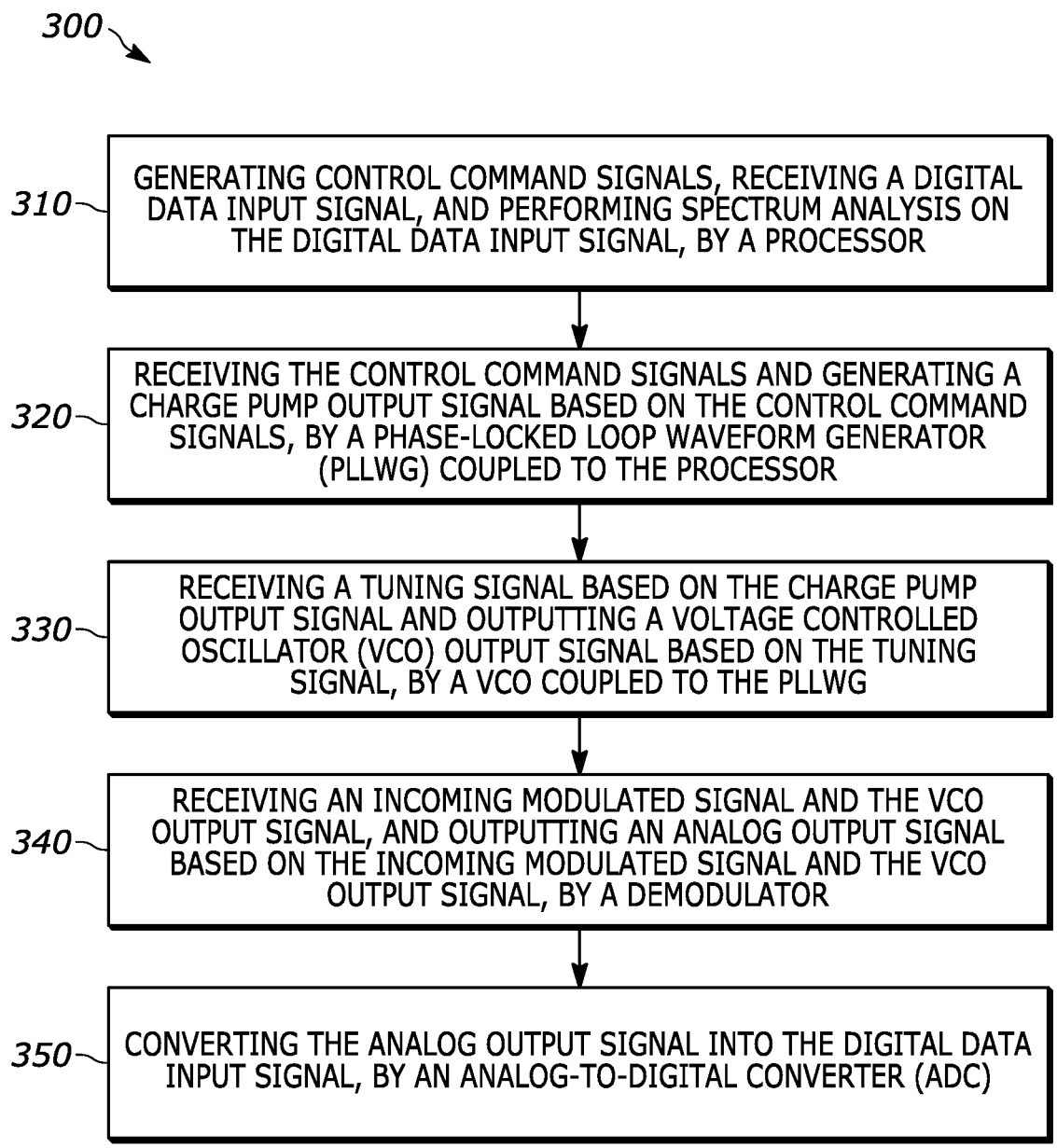
FIG. 3 illustrates an example method for performing spectrum analysis on the incoming modulated signal shown in FIG. 1, in accordance with at least one embodiment disclosed herein.

FIG. 3 illustrates a method 300 including a process 310 generating the control command signals 107, receiving the digital data input signal 106, and performing spectrum analysis on the digital data input signal 106. In at least one embodiment, process 310 is performed by a processor, such as the microcontroller 100. Process 310 proceeds to process 320.

Process 320 includes receiving the control command signals 107 and generating the charge pump output signal 112 based on the control command signals 107. In at least one embodiment, this process 320 is performed by the PLLWG 110 coupled to the processor 100. Process 320 proceeds to process 330.

Process 330 includes receiving a tuning signal, such as at least one of the first raw tuning signal 114 and the second raw tuning signal 115, based on the charge pump output signal 112 and outputting a VCO output signal, such as at least one of the amplified first VCO output signal 135 and the second amplified VCO output signal 185. based on this tuning signal. In at least one embodiment, this process 330 is performed by a VCO, such as by at least one of the high-frequency VCO 130 and the low-frequency VCO 180 that are coupled to the PLLWG 110. Process 330 proceeds to process 340.

Process 340 includes receiving the incoming modulated signal 165 and the VCO output signal from process 330, and outputting an analog output signal, such as at least one of the in-phase analog output signal 161 and the quadrature analog output signal 162, based on the incoming modulated signal 165 and the VCO output signa from process 330. In at least one embodiment, this process 340 is performed by a demodulator, such as the IQ demodulator 160. Process 340 proceeds to process 350.

Process 350 includes converting the analog output signal from process 340 into the digital data input signal 106. In at least one embodiment, process 350 is performed by the ADC 150. The method 300 can further include any of the processes and any of the components of the apparatus 50 described above for FIG. 1.

The foregoing description merely explains and illustrates the disclosure and the disclosure is not limited thereto except insofar as the appended claims are so limited, as those skilled in the art who have the disclosure before them will be able to make modifications without departing from the scope of the disclosure.

What is claimed is:

1. An apparatus, comprising:
 a processor to generate control command signals, receive a digital data input signal, and analyze the digital data input signal;
 a Phase-Locked Loop Waveform Generator (PLLWG), coupled to the processor, to receive the control command signals and generate a charge pump output signal based on the control command signals;

a Voltage Controlled Oscillator (VCO), coupled to the PLLWG, to receive a tuning signal based on the charge pump output signal and output a VCO output signal based on the tuning signal;

a demodulator to receive an incoming modulated signal and the VCO output signal, and output an in-phase analog data signal and a quadrature analog data signal based on the incoming modulated signal and the VCO output signal;

an image reject circuit to receive the in-phase analog data signal and the quadrature analog data signal and sum the in-phase analog data signal and the quadrature analog data signal into the analog output signal; and an Analog-to-Digital Converter (ADC) to convert the analog output signal into the digital data input signal, wherein the VCO is a first VCO and the VCO output signal is a first VCO output signal, the apparatus further comprising:

a second VCO, coupled to the PLLWG, to receive the tuning signal based on the charge pump output signal and output a second VCO output signal based on the tuning signal; and a tuning signal switch to receive the charge pump output signal and selectively output a first raw tuning signal and a second raw tuning signal directed to the first VCO and the second VCO, respectively;

wherein the demodulator is an IQ demodulator to receive a selected frequency signal based on one of the first and second VCO output signals, and output the in-phase analog data signal and the quadrature analog data signal based on the incoming modulated signal and one of the first and second VCO output signals; and wherein the ADC converts the in-phase analog data signal and the quadrature analog data signal into a digital data input signal, and outputs the digital data input signal to the processor.

2. The apparatus according to claim 1, wherein the tuning signal switch is a single-pole, double throw switch with an on-state resistance below 5 Ohms and an off-state capacitance below 50 pF.

3. The apparatus according to claim 1, further comprising:
a first Phase-Locked Loop (PLL) filter coupled to both the PLLWG and the first VCO, the first PLL filter to receive a first raw tuning signal and condition the first raw tuning signal; and a second PLL filter coupled to both the PLLWG and the first VCO, the second PLL filter to receive a second raw tuning signal and condition the second raw tuning signal.

4. The apparatus according to claim 1, further comprising an IQ conditioner to receive the in-phase analog signal and the quadrature analog signal from the IQ demodulator, and to generate an in-phase analog data signal and a quadrature analog data signal from the in-phase analog signal and the quadrature analog signal, respectively.

5. The apparatus according to claim 4, further comprising an image rejection circuit to receive the in-phase analog data and the quadrature analog data from the IQ conditioner, provide a relative phase shift between the in-phase analog data and the quadrature analog data to match the in-phase analog data and the quadrature analog data in phase while preserving relative amplitudes thereof, and sum the in-phase analog data and the quadrature analog data together to generate a combined analog data signal, the relative phase shift between the in-phase analog data and the quadrature analog data ensuring that, when summed, an image portion of the combined analog data signal is removed.

6. The apparatus according to claim 1, further comprising a VCO select switch, coupled to the first VCO and the second VCO, to receive both the first VCO output signal and the second VCO output signal and selectively output one of the first VCO output signal and the second VCO output signal.

7. A method, comprising:
generating control command signals, receiving a digital data input signal, and analyzing the digital data input signal, by a processor;

receiving the control command signals and generating a charge pump output signal based on the control command signals, by a Phase-Locked Loop Waveform Generator (PLLWG) coupled to the processor;

receiving a tuning signal based on the charge pump output signal and outputting a voltage controlled oscillator (VCO) output signal based on the tuning signal, by a VCO coupled to the PLLWG;

receiving an incoming modulated signal and the VCO output signal, and outputting an in-phase analog data signal and a quadrature analog data signal based on the incoming modulated signal and the VCO output signal, by a demodulator;

receiving the in-phase analog data signal and the quadrature analog data signal and summing the in-phase analog data signal and the quadrature analog data signal into the analog output signal, by an image reject circuit; and converting the analog output signal into the digital data input signal, by an Analog-to-Digital Converter (ADC), wherein the VCO is a first VCO, the VCO output signal is a first VCO output signal, and the demodulator is an IQ demodulator, the method further comprising:

receiving the tuning signal based on the charge pump output signal and outputting a second VCO output signal based on the tuning signal, by a second VCO coupled to the PLLWG;

receiving the charge pump output signal and selectively outputting a first raw tuning signal and a second raw tuning signal directed to the first VCO and the second VCO, respectively, by a tuning signal switch;

receiving a selected frequency signal based on one of the first and second VCO output signals, and outputting the in-phase analog data signal and the quadrature analog data signal based on the incoming modulated signal and one of the first and second VCO output signals, by the IQ demodulator; and converting the in-phase analog signal and the quadrature analog signal into a digital data input signal, and outputting the digital data input signal to the processor, by the ADC.

8. The method according to claim 7, wherein the tuning signal switch is a single-pole, double throw switch with an on-state resistance below 5 Ohms and an off-state capacitance below 50 pF.

9. The method according to claim 7, further comprising:
receiving a first raw tuning signal and conditioning the first raw tuning signal, by a first Phase-Locked Loop (PLL) filter coupled to both the PLLWG and the first VCO; and receiving a second raw tuning signal and conditioning the second raw tuning signal, by a second PLL filter coupled to both the PLLWG and the first VCO.

10. The method according to claim 7, further comprising receiving an in-phase analog signal and a quadrature analog signal from the IQ demodulator, and generating the in-phase analog data signal and the quadrature analog data signal from the in-phase analog signal and the quadrature analog signal, respectively, by an IQ conditioner.

11. The method according to claim 10, further comprising receiving the in-phase analog data and the quadrature analog data from the IQ conditioner, providing a relative phase shift between the in-phase analog data and the quadrature analog data to match the in-phase analog data and the quadrature analog data in phase while preserving relative amplitudes thereof, and summing the in-phase analog data and the quadrature analog data together to generate a combined analog data signal, by an image rejection circuit, the relative phase shift between the in-phase analog data and the quadrature analog data ensuring that, when summed, an image portion of the combined analog data signal is removed.

12. The method according to claim 7, further comprising receiving both the first VCO output signal and the second VCO output signal and selectively output one of the first VCO output signal and the second VCO output signal, by a VCO select switch coupled to the first VCO and the second VCO.

\* \* \* \* \*